(12) United States Patent
Hall et al.

(10) Patent No.: US 7,993,977 B2
(45) Date of Patent: Aug. 9, 2011

(54) METHOD OF FORMING MOLDED STANDOFF STRUCTURES ON INTEGRATED CIRCUIT DEVICES

(75) Inventors: Frank Hall, Boise, ID (US); James Voelz, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/772,452

(22) Filed: Jul. 2, 2007

(65) Prior Publication Data

US 2009/0011544 A1 Jan. 8, 2009

(51) Int. Cl.
*H01L 21/00* (2006.01)

(52) U.S. Cl. ............ 438/116; 438/64; 438/68; 438/106; 438/113; 257/E21.001; 257/E21.505

(58) Field of Classification Search .................. 438/116, 438/64, 68, 106, 113
See application file for complete search history.

(56) References Cited

U.S. PATENT DOCUMENTS

| | | | |
|---|---|---|---|
| 5,634,585 A | 6/1997 | Stansbury | 228/105 |
| 5,697,825 A | 12/1997 | Dynka et al. | 445/25 |
| 5,760,465 A * | 6/1998 | Alcoe et al. | 257/669 |
| 5,788,551 A | 8/1998 | Dynka et al. | 445/25 |
| 5,827,102 A | 10/1998 | Watkins et al. | 445/25 |
| 5,997,378 A | 12/1999 | Dynka et al. | 445/25 |
| 6,017,829 A | 1/2000 | Farrar | 438/783 |
| 6,255,772 B1 | 7/2001 | Cathey et al. | 313/495 |
| 6,262,486 B1 | 7/2001 | Farrar | 257/758 |
| 6,342,406 B1 * | 1/2002 | Glenn et al. | 438/57 |
| 6,428,650 B1 * | 8/2002 | Chung | 156/250 |
| 6,432,844 B1 | 8/2002 | Farrar | 438/783 |
| 6,495,919 B2 | 12/2002 | Farrar | 257/759 |
| 6,495,956 B2 | 12/2002 | Cathey et al. | 313/495 |
| 6,566,745 B1 | 5/2003 | Beyne et al. | |
| 6,600,334 B1 * | 7/2003 | Hembree et al. | 324/765 |
| 6,833,612 B2 | 12/2004 | Kinsman | 257/680 |
| 6,885,107 B2 | 4/2005 | Kinsman | 257/778 |
| 6,930,446 B1 | 8/2005 | Moradi | 313/495 |
| 6,940,141 B2 | 9/2005 | Kinsman | 257/433 |
| 6,943,423 B2 * | 9/2005 | Kim | 257/433 |
| 6,952,046 B2 * | 10/2005 | Farrell et al. | 257/678 |
| 6,956,295 B2 | 10/2005 | Kinsman | 257/786 |
| 6,964,886 B2 | 11/2005 | Kinsman | 438/125 |
| 6,995,462 B2 | 2/2006 | Bolken et al. | 257/680 |

(Continued)

FOREIGN PATENT DOCUMENTS

EP 1244151 9/2002

(Continued)

OTHER PUBLICATIONS

Garrou, "Wafer Level Chip Scale Packaging (WL-CSP): An Overview," *IEEE Transactions on Advanced Packaging*, 23:198-205, May 2000.

(Continued)

*Primary Examiner* — Angel Roman
(74) *Attorney, Agent, or Firm* — Perkins Coie LLP

(57) ABSTRACT

A method of forming molding standoff structures on integrated circuit devices is disclosed which includes forming a plurality of standoff structures on a substantially rectangular sheet of transparent material and, after forming the standoff structures, singulating the substantially rectangular sheet of transparent material into a plurality of individual transparent members, each of which comprise at least one of the plurality of standoff structures.

19 Claims, 3 Drawing Sheets

U.S. PATENT DOCUMENTS

| | | | |
|---|---|---|---|
| 7,026,189 B2 * | 4/2006 | Chen et al. | 438/113 |
| 7,105,930 B2 | 9/2006 | Lua et al. | 257/778 |
| 7,112,471 B2 | 9/2006 | Boon et al. | 438/116 |
| 7,115,961 B2 | 10/2006 | Watkins et al. | 257/433 |
| 7,115,986 B2 | 10/2006 | Moon et al. | 257/701 |
| 7,122,390 B2 | 10/2006 | Kinsman | 438/26 |
| 7,169,645 B2 | 1/2007 | Bolken et al. | 438/116 |
| 7,190,039 B2 | 3/2007 | Boettiger et al. | 257/432 |
| 7,199,439 B2 | 4/2007 | Farnworth et al. | 257/433 |
| 7,214,919 B2 | 5/2007 | Boemler | 250/208.1 |
| 7,359,579 B1 * | 4/2008 | Paek et al. | 382/312 |
| 2004/0214420 A1 * | 10/2004 | Brouillette et al. | 438/616 |
| 2005/0161756 A1 * | 7/2005 | Sun et al. | 257/433 |
| 2005/0172439 A1 * | 8/2005 | Weihrauch | 15/187 |
| 2005/0202598 A1 * | 9/2005 | Suehiro et al. | 438/118 |
| 2005/0253213 A1 * | 11/2005 | Jiang et al. | 257/433 |
| 2005/0285016 A1 | 12/2005 | Kong et al. | |
| 2006/0030079 A1 * | 2/2006 | Huang et al. | 438/116 |
| 2006/0157651 A1 | 7/2006 | Yamaguchi et al. | |
| 2006/0211173 A1 * | 9/2006 | Hsiao et al. | 438/116 |
| 2006/0246630 A1 * | 11/2006 | Sunohara et al. | 438/125 |
| 2007/0029277 A1 * | 2/2007 | Jacobowitz et al. | 216/24 |
| 2007/0164386 A1 * | 7/2007 | Chang et al. | 257/434 |
| 2007/0178630 A1 * | 8/2007 | Huang | 438/116 |
| 2007/0190691 A1 * | 8/2007 | Humpston et al. | 438/113 |
| 2007/0190747 A1 * | 8/2007 | Humpston et al. | 438/460 |
| 2007/0196954 A1 * | 8/2007 | Teshirogi et al. | 438/113 |
| 2007/0284681 A1 * | 12/2007 | Massieu et al. | 257/415 |

FOREIGN PATENT DOCUMENTS

| | | |
|---|---|---|
| EP | 1463120 | 9/2004 |
| EP | 1526579 | 4/2005 |

OTHER PUBLICATIONS

Kelly et al., "Investigation of Thermo-Mechanically Induced Stress in a PQFP 160 Using Finite Element Techniques," *IEEE*, pp. 467-472, 1992.

International Search Report and Written Opinion for International Application No. PCT/US2008/068921, Oct. 13, 2008.

* cited by examiner

METHOD OF FORMING MOLDED STANDOFF STRUCTURES ON INTEGRATED CIRCUIT DEVICES

BACKGROUND OF THE INVENTION

1. Field of the Invention

The present invention generally relates to the field of manufacturing and package of microelectronic devices, and, more particularly, to a method of forming molded standoff structures on integrated circuit devices.

2. Description of the Related Art

Microelectronic devices generally have a die (i.e., a chip) that includes integrated circuitry having a high density of very small components. In a typical process, a large number of die are manufactured on a single wafer using many different processes that may be repeated at various stages (e.g., implanting, doping, photolithography, chemical vapor deposition, plasma vapor deposition, plating, planarizing, etching, etc.). Each of the die typically include an array of very small bond pads electrically coupled to the integrated circuitry. The bond pads are the external electrical contacts on the die through which the supply voltage, signals, etc. are transmitted to and from the integrated circuitry. The die are then separated from one another (i.e., singulated) by backgrinding and cutting the wafer. After the wafer has been singulated, the individual die are typically "packaged" to couple the bond pads to a larger array of electrical terminals that can be more easily coupled to the various power supply lines, signal lines and ground lines.

An individual die can be packaged by electrically coupling the bond pads on the die to arrays of pins, ball pads or other types of electrical terminals, and then encapsulating the die to protect it from environmental factors (e.g., moisture, particulates, static electricity and physical impact). For example, in one application, the bond pads can be electrically connected to contacts on an interposer substrate that has an array of ball pads. The die and a portion of the interposer substrate are then encapsulated with molding compound.

Electronic products require packaged microelectronic devices to have an extremely high density of components in a very limited space. For example, the space available for memory devices, processors, displays and other microelectronic components is quite limited in cell phones, PDAs, portable computers and many other products. As such, there is a strong drive to reduce the height of the packaged microelectronic device and the surface area or "footprint" of the microelectronic device on a printed circuit board. Reducing the size of the microelectronic device is difficult because high performance microelectronic devices generally have more bond pads, which result in larger ball grid arrays and thus larger footprints.

Image sensor die present additional packaging problems. Image sensor die include an active area that is responsive to electromagnetic radiation, e.g., light emitted from a light source. In packaging, it is important to cover and protect the active area without obstructing or distorting the passage of light or other electromagnetic radiation. Typically, an image sensor die is packaged by placing the die in a recess of a ceramic substrate and attaching a glass window to the die over the active area to hermetically seal the package.

FIG. 1 is a schematic, partial cross-sectional view of an illustrative example of a prior art image sensor die 10 formed in a semiconducting substrate 12. The image sensor die 10 comprises a window or glass 14 that is positioned above an active area 18 formed in the substrate 12. The active area 18 typically contains a plurality of sensor cells (not shown) that are responsive to electromagnetic radiation that passes through the window 14. The image sensor die 10 further includes a plurality of bond pads 22 and a schematically depicted integrated circuitry 20 that is electrically coupled to the bond pads 22 and the active area 18. An adhesive or epoxy 16 is used to attach the window 14 to the substrate 12.

Also depicted in FIG. 1 are a plurality of standoff structures 24 that may be formed on the substrate 12. Among other things, the standoff structures 24 are provided to maintain at least a set distance (corresponding to the height of the standoff structures 24) between the glass 14. Such standoff structures 24 may not be present in all applications One illustrative technique for manufacturing the standoff structures 24 involves the use of traditional equipment used in manufacturing integrated circuit devices. For example, a sheet of glass, typically supplied as a square or rectangular piece of material, is initially cut into so-called "glass rounds." These glass rounds have substantially the same round configuration as that of the semiconducting substrates, e.g., eight to twelve inches in diameter, that are used in manufacturing integrated circuit devices. After the glass rounds are formed, the standoff structures 24 are formed using traditional processing tools commonly found in semiconductor manufacturing operations. For example, the glass rounds may be positioned in a photolithography tool and the standoff structures 24 may be formed by performing traditional photolithography processes, e.g., spin-coat, soft-bake, expose, develop, hard-bake. Of course, using this technique, the standoff structures 24 may have any desired shape or configuration. Another technique might involve deposition of a layer of material on the glass round, followed by the formation of a masking layer, e.g., a patterned layer of photoresist material. Third, a traditional etching process may be performed to define the standoff structures 24 from the layer of material.

After the standoff structures 24 are formed, the glass round is then cut into a plurality of individual glass pieces or windows 14 that will be positioned over individual die, as depicted in FIG. 1. The aforementioned process of forming the standoff structures 24 is relatively expensive and time-consuming. Moreover, employing such manufacturing techniques may occupy very valuable semiconductor manufacturing equipment and therefore prevent the use of such equipment for manufacturing integrated circuit die.

BRIEF DESCRIPTION OF THE DRAWINGS

The invention may be understood by reference to the following description taken in conjunction with the accompanying drawings, in which like reference numerals identify like elements, and in which.

Figure 1:
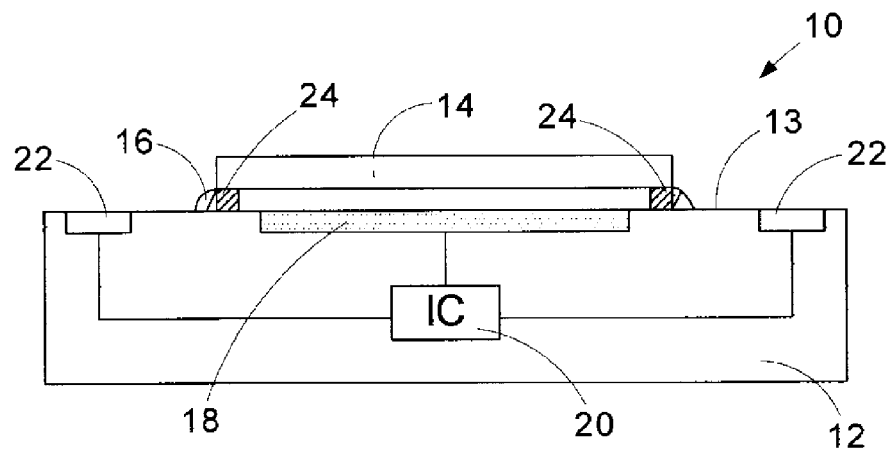
FIG. 1 is an example of an illustrative prior art image sensor die.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Although various regions and structures shown in the drawings are depicted as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the subject matter disclosed herein.

Figure 2A:
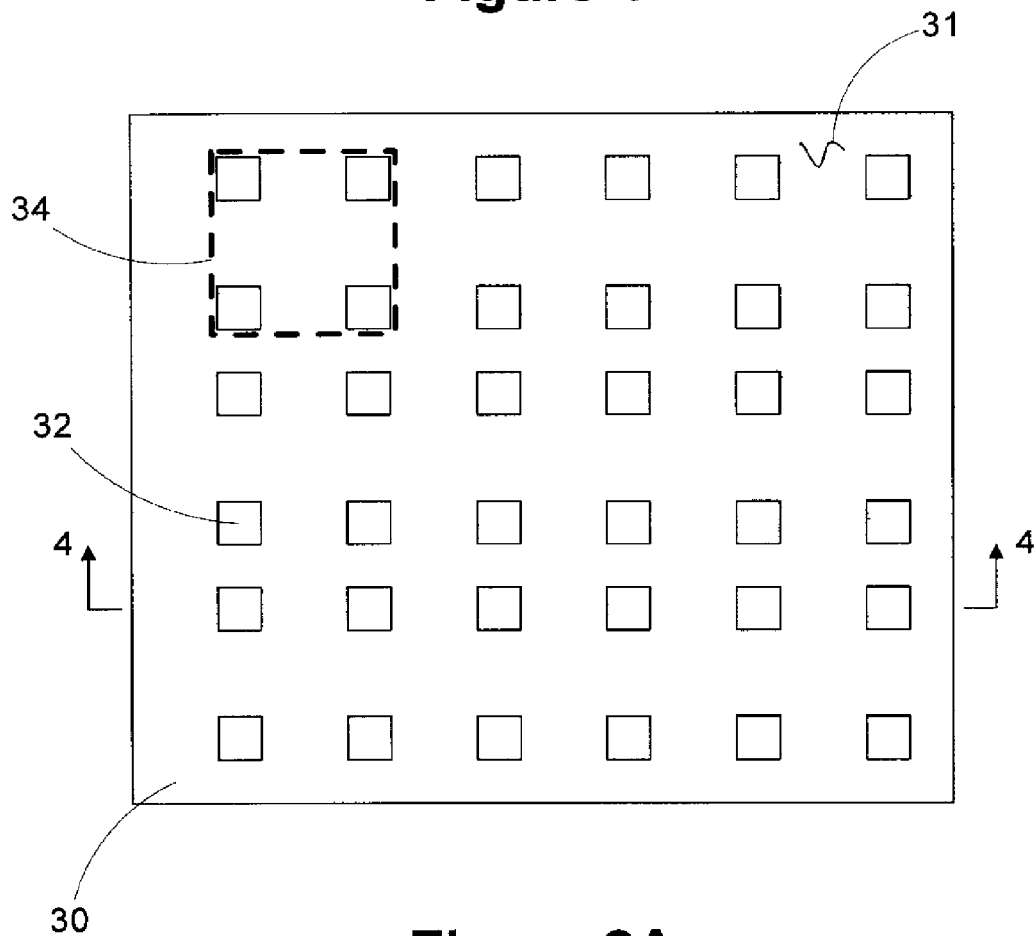
FIGS. 2A-2C are examples of illustrative standoff structures that may be formed on a window for an integrated circuit device.

In general, the present subject matter is directed to using transfer molding techniques to form standoff structures on a transparent cover or glass of an integrated circuit device. As shown in FIG. 2A, a plurality of standoff structures 32 are formed on a surface 31 of a transparent member 30. Ultimately, the transparent member 30 may be cut or singulated into the final desired size, as reflected by the dashed line 34. Thereafter, the singulated portions of the transparent member 30 will ultimately be positioned above an area of a die having light sensing circuitry formed therein. In the illustrative example depicted in FIG. 2A, the dashed line 34 depicts the final outline of portions of the transparent member 30 that will be cut and placed over an individual die.

The transparent member 30 may be comprised of any of a number of materials that are suitable for the intended purpose of the transparent member 30. In one illustrative example, the transparent member 30 is comprised of glass. The transparent member 30 is normally supplied in square or rectangular sheets. According to one aspect of the present disclosure, standoff structures 32 may be formed on the transparent member 30 in its as-supplied configuration, e.g., square or rectangular. This avoids the time and cost associated with forming glass rounds from a rectangular piece of material as was done using prior art techniques described above.

Figure 2B:
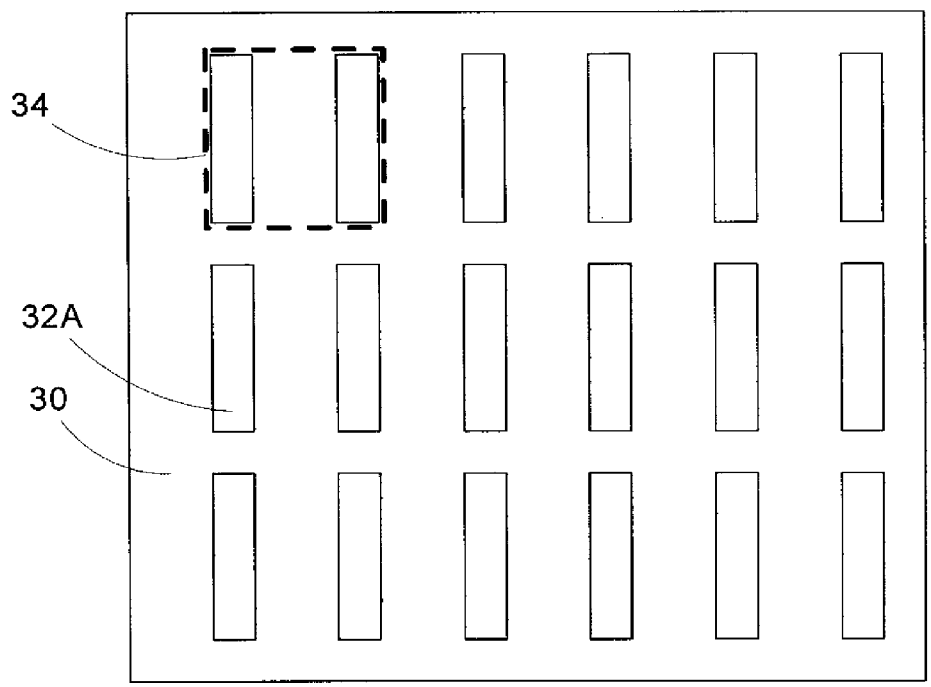
Figure 2C:
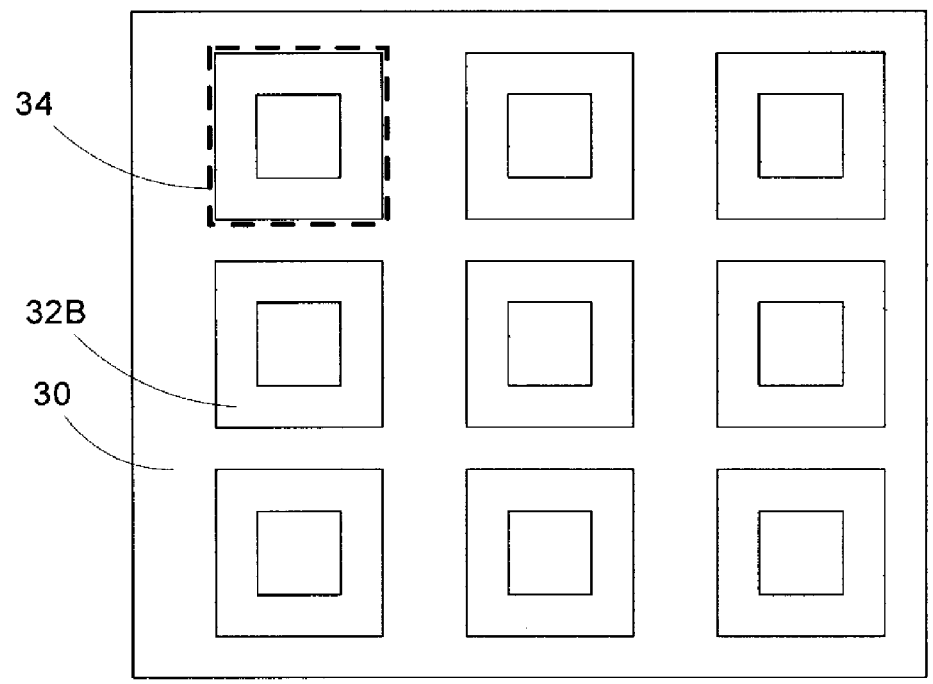

As illustrated in FIGS. 2A-2C, the standoff structures 32 described herein may be formed to any desired shape or configuration, e.g., rectangular or round posts, lines, etc. As shown in FIG. 2A, the standoff structures 32 are rectangular post structures. After all of the standoff structures 32 are formed, the transparent member 30 may be cut into the desired shape or configuration, as indicated by the dashed line 34, using known techniques. For example, as depicted in FIG. 2A, the four standoff structures 32 may be employed in positioning a singulated portion of the transparent member 30 above an integrated circuit die. In FIG. 2B, the illustrative standoff structures 32 are essentially line-type members that may be positioned on opposite sides of the active area of the integrated circuit die. In FIG. 2C, the standoff structure 32 is essentially one continuous structure that extends around the outer perimeter of the interior portion of the transparent member 30.

Figure 3:
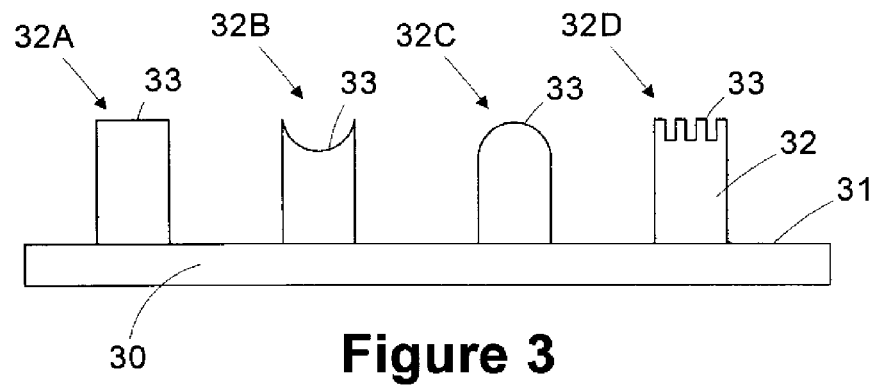
FIG. 3 depicts a plurality of standoff structures having varied end configurations.

As indicated previously, the size, shape and configuration of the standoff structures 32 described herein may vary. For example, FIG. 3 depicts a plurality of standoff structures 32 formed on the surface 31 of the transparent member 30. The contact end 33 of the standoff structure 32, the end that will contact the substrate, may be formed so as to have any desired configuration. For example, as shown in FIG. 3, the contact end 33 of the illustrative standoff structures 32A, 32B, 32C and 32D, respectively, is planar, concave, convex and grooved or castled. Thus, the configuration of the contact end 33 may be varied to facilitate attachment of the glass member 30 to an individual die.

As mentioned previously, the standoff structures 32 described herein may be formed using known transfer molding techniques. Transfer molding is a widely adopted method for plastic encapsulation of semiconductor devices. In transfer molding, the mold generally includes a lower half and an upper half. The lower half of the mold will typically include multiple cavities and a concave portion, called a pot, which communicates with the multiple cavities through runners. A thermosetting resin is heated in the pot and fed therefrom by a plunger. The resin reaches the cavities through the runners. The resin is typically then heated to cure the resin.

Figure 4:
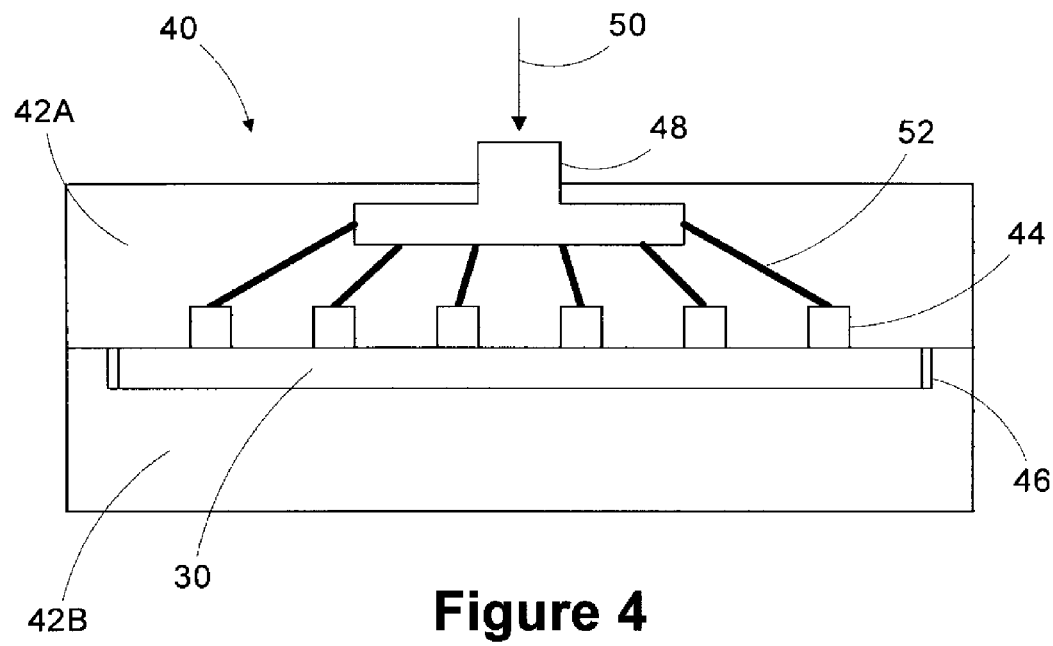
FIG. 4 is a schematic cross-sectional side view of one illustrative technique for forming the standoff structures described herein.

FIG. 4 schematically depicts an illustrative transfer molding apparatus 40 that may be employed to form the standoff structures described herein. Of course, not all details of an actual molding apparatus are depicted in FIG. 4 so as not to obscure the present invention. As shown therein, the transfer molding apparatus 40 comprises an upper half 42A and a lower half 42B. The transparent member 30 is positioned in a cavity 46 formed in the lower half 42B of the mold 40. A plurality of mold cavities 44 are formed in the upper half 42A of the mold 40. The cavities 44 generally correspond to the desired configuration of the standoff structures 32 to be formed on the transparent member 30. For example, FIG. 4 is a cross-sectional view taken at the location depicted in FIG. 2A. The cavities 44 in FIG. 4 generally correspond to the illustrative rectangular post standoff structures 32 depicted in FIG. 2A. The desired molding material, e.g., an epoxy or traditional mold compound, is introduced into the mold, as indicated by the arrow 50. The mold material exits the pot 48 and flows to the desired cavities 44 via the schematically depicted runners 52.

Figure 5:
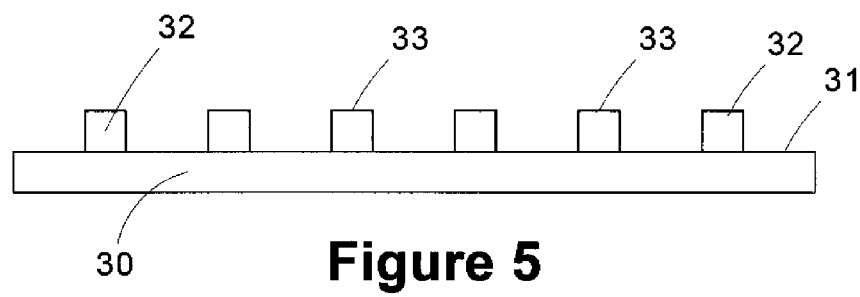
FIG. 5 is a schematic cross-sectional view of an illustrative transparent member having a plurality of standoff structures formed thereabove.

After the transfer molding process is complete, and the standoff structures 32 are formed on the surface 31 of the transparent member 30, the mold 40 is separated and the transparent member 30, with the standoff structures 32 formed thereon, is removed from the mold 40 and trimmed as necessary. A schematic cross-sectional view of the transparent member 30 at this point in the process is depicted in FIG. 5. A dicing or cutting process is then performed to singulate the transparent member 30 into the desired individual members, as reflected by the dashed line 34 depicted in FIGS. 2A-2C. An adhesive material may then be applied to the contact surface 33 of the standoff structures 32 so that the singulated transparent members or window may be attached to the die. The physical size of the standoff structures 32 may also vary, e.g., they may have a height of approximately 70-120 μm. The thickness of the transparent member 30 may also vary, e.g., it may have a thickness of approximately 400-550 μm.

What is claimed:

1. A method of forming standoff structures on integrated circuit devices, comprising:
   forming a plurality of electrically insulating standoff structures on a substantially rectangular sheet of transparent material, wherein individual electrically insulating standoff structures have a non-planar contact surface and comprise at least one of post structures wherein individual post structures are spaced apart by a gap, or line-type structures wherein individual line-type structures are separated by a gap; and
   after forming the electrically insulating standoff structures, singulating the substantially rectangular sheet of transparent material into a plurality of individual transparent members, each of which comprise at least one of the plurality of electrically insulating standoff structures.

2. The method of claim 1, further comprising attaching one of the plurality of individual transparent members to one of a plurality of integrated circuit die.

3. The method of claim 2, wherein attaching one of the plurality of individual transparent members to one of the plurality of integrated circuit dies comprises applying an adhesive material to a contact surface of the at least one electrically insulating standoff structure and urging the contact surface into contact with the die.

4. The method of claim 1, wherein the sheet of transparent material comprises glass.

5. The method of claim 1, wherein forming the plurality of electrically insulating standoff structures comprises performing a transfer molding process to form the plurality of electrically insulating standoff structures.

6. The method of claim 5, wherein the electrically insulating standoff structures have a generally rectangular configuration.

7. The method of claim 1, wherein the contact surface of the plurality of electrically insulating standoff structures is concave, convex or grooved.

8. A method, comprising:
   positioning a substantially rectangular sheet of transparent material in a molding apparatus;
   introducing an electrically insulating molding material into the molding apparatus so as to form a plurality of standoff structures on a surface of the substantially rectangular sheet of transparent material, wherein individual standoff structures have a non-planar contact surface and comprise at least one of post structures wherein individual post structures are spaced apart by a gap, and line-type structures wherein individual line-type structures are separated by a gap; and
   after forming the standoff structures, singulating the substantially rectangular sheet of transparent material into a plurality of individual transparent members, each of which having at least one of the plurality of standoff structures.

9. The method of claim 8, further comprising attaching one of the plurality of individual transparent members to one of a plurality of integrated circuit dies.

10. The method of claim 8, wherein the sheet of transparent material comprises glass.

11. The method of claim 8, wherein a contact surface of the plurality of standoff structures is concave, convex or grooved.

12. A method of forming standoff structures on integrated circuit devices, comprising:
    performing a transfer molding process to form a plurality of non-conductive standoff structures on a substantially rectangular sheet of glass, the non-conductive standoff structures having a contact surface that is non-planar, wherein the non-conductive standoff structures comprise at least one of post structures or line-type structures, each of the post structures or line-type structures being separated by a gap;
    after forming the non-conductive standoff structures, singulating the substantially rectangular sheet of glass into a plurality of individual glass members, each of which comprises a plurality of non-conductive standoff structures; and
    attaching one of the plurality of individual glass members to one of a plurality of integrated circuit dies.

13. The method of claim 12, wherein the contact surface of the plurality of non-conductive standoff structures is concave, convex or grooved.

14. A method, comprising:
    forming a plurality of standoff structures on a substantially rectangular sheet of glass, each standoff structure having a substantially rectangular cross-sectional shape and being separated from adjacent standoff structures by a gap, wherein the standoff structures are electrically isolating;
    forming a concave, convex, or grooved contact surface on the plurality of standoff structures;
    after forming the standoff structures, singulating the substantially rectangular sheet of transparent material into a plurality of individual transparent members, each of which comprises at least one of the plurality of standoff structures; and
    applying an adhesive material to a contact surface of the at least one standoff structure and urging the contact surface into contact with an integrated circuit die.

15. The method of claim 14, wherein forming the plurality of standoff structures comprises performing a transfer molding process to form the plurality of standoff structures.

16. The method of claim 14, wherein the standoff structures comprise at least one of post structures and line structures.

17. A method, comprising:
    positioning a substantially rectangular sheet of glass in a molding apparatus;
    introducing a molding material into the molding apparatus so as to form a plurality of substantially rectangular non-conductive standoff structures on a surface of the substantially rectangular sheet of transparent material, the plurality of non-conductive standoff structures having a non-planar contact surface and being separated from adjacent non-conductive standoff structures by a gap;
    after forming the non-conductive standoff structures, singulating the substantially rectangular sheet of transparent material into a plurality of individual transparent members, each of which comprise at least one of the plurality of non-conductive standoff structures; and
    attaching one of the plurality of individual transparent members to one of a plurality of integrated circuit dies.

18. The method of claim 17, wherein the contact surface of the plurality of non-conductive standoff structures is concave, convex or grooved.

19. The method of claim 17, wherein attaching one of the plurality of individual transparent members to one of the plurality of integrated circuit dies comprises applying an adhesive material to a contact surface of the at least one non-conductive standoff structure and urging the contact surface into contact with the die.

* * * * *